United States Patent [19]

Nakamura

[11] 4,128,331
[45] Dec. 5, 1978

[54] PROCESS PRINTING APPARATUS

[76] Inventor: Saburo Nakamura, 21, Tsutsui-cho 1-chome, Higashi-ku, Nagoya-shi, Aichi-ken, Japan

[21] Appl. No.: 819,247

[22] Filed: Jul. 27, 1977

[51] Int. Cl.² .................... G03B 27/32; G03B 27/42; G03B 27/58
[52] U.S. Cl. .................................. 355/32; 355/53; 355/74; 355/77
[58] Field of Search .................. 355/18, 32, 71, 77, 355/63, 95, 72, 74, 75, 53, 54, 67, 60

[56] References Cited

U.S. PATENT DOCUMENTS

| | | | |
|---|---|---|---|
| 2,415,424 | 2/1947 | Gaebel | 355/60 |
| 2,605,675 | 8/1952 | Mourfield | 355/54 |
| 3,938,887 | 2/1976 | Nygaard et al. | 355/63 |
| 4,043,660 | 8/1977 | Wingerter | 355/77 |
| 4,047,813 | 9/1977 | Spence-Bate | 355/95 |
| 4,057,347 | 11/1977 | Moriyama et al. | 55/67 |

FOREIGN PATENT DOCUMENTS 676962  6/1939  Fed. Rep. of Germany ............. 355/75

*Primary Examiner*—Donald Griffin
*Attorney, Agent, or Firm*—Basile and Weintraub

[57] ABSTRACT

An apparatus for making reproductions or negatives for plate making comprises a base frame, a vertical supporting post secured at its lower end to the base frame, a master copy holding frame spaced above the base frame and vertically movably supported on the supporting post, a light source on the master copy holding frame, a lens system on the underside of the master copy holding frame and a copy paper holding plate on the base plate. The light source, the lens system and the copy paper holding plate are so positioned relative to one another as to be aligned with the axis of light emitted by the light source. The master copy holding plate carries a movable plate which is horizontally movable both longitudinally and transversely of the master copy holding frame. A master film holding plate is adapted to support a plurality of master films thereon and be removably secured to the movable plate which is movable to position the master films selectively for exposure to the light. The master copy holding frame is provided with a masking cover for selective exposure of the master films to light. The lens system is vertically movable and the copy paper holding plate carries a focusing plate which is horizontally movable both longitudinally and transversely of the copy paper holding plate. A plurality of horizontally movable overlays are provided above the focusing plate. A supporting post is of the hollow construction and contains a pair of vertical rods which respectively effect the vertical movement of the master copy holding frame and the lens system.

6 Claims, 6 Drawing Figures

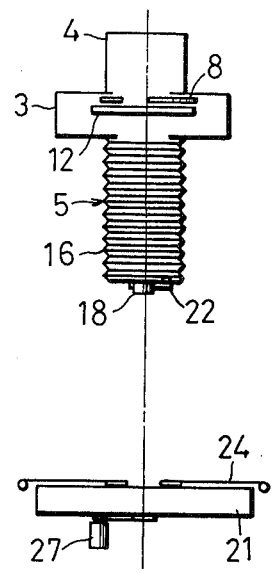
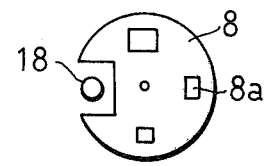
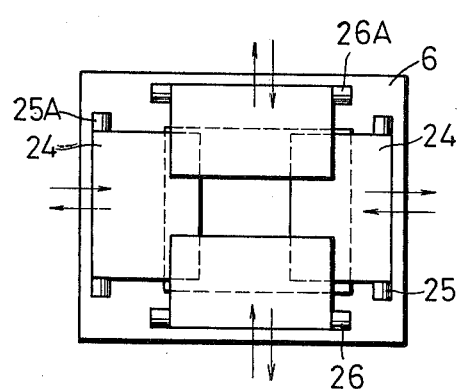
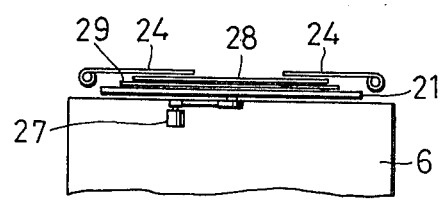

PROCESS PRINTING APPARATUS

This invention relates to the automatic manufacture of reproductions or negatives for use in color plate making, from a plurality of master films.

The production of process color plates is usually accomplished by preparing four color-separation negatives from a master copy, photographing them on a planar film transparency through a screen and superimposing them on one another. When a printed copy is to be made from a negative having images laid out from a plurality of original color films, four color-separation negatives are photographed on a planar transparency, and the individual color-separation negatives for the images of a single color are disposed on the transparency in accordance with a predetermined layout and photographed through a screen. The color-separation negatives representing the other three colors are likewise disposed exactly in accordance with the layout and photographed through a screen. These operations are performed manually and require a very high degree of skill and technique. They require lots of time, labor and care.

It is an object of this invention to provide a novel and improved apparatus which permits reproductions or negatives for use in color plate making to be automatically made from a plurality of master films speedily and inexpensively without requiring any special skill and technique. According to this invention, a plurality of master films, e.g., dissolved negatives or positives or color films, are placed together on a master copy holding plate. The master films are successively photographed on a transparency in accordance with a predetermined layout to provide negative or positive images which are all enlarged or reduced in size at one and the same rate or individually at different rates, whereby yellow, magenta, cyan and black plates are automatically obtained in accordance with the predetermined layout. Images of master films are successively projected on a transparency on a focusing plate in accordance with a computerized program defining the requirements for enlargement or reduction in size, selection of shape and position, focusing and masking, so that precise and speedy photographing may be automatically achieved without requiring any high degree of skill and technique.

The foregoing and other objects, novel features and advantages of this invention will become apparent from the following detailed description of a preferred embodiment as shown in the accompanying drawings.

The invention will now be described in further detail by way of example with reference to the accompanying drawings, in which:

FIG. 3 is a fragmentary front elevational view in vertical section of the apparatus;

FIG. 3A is a top plan view of the mask cover;

FIG. 4 is a top plan view of the device for the sliding movement of the overlays; and FIG. 5 is a vertical sectional view of the device shown in FIG. 4.

Figure 1:
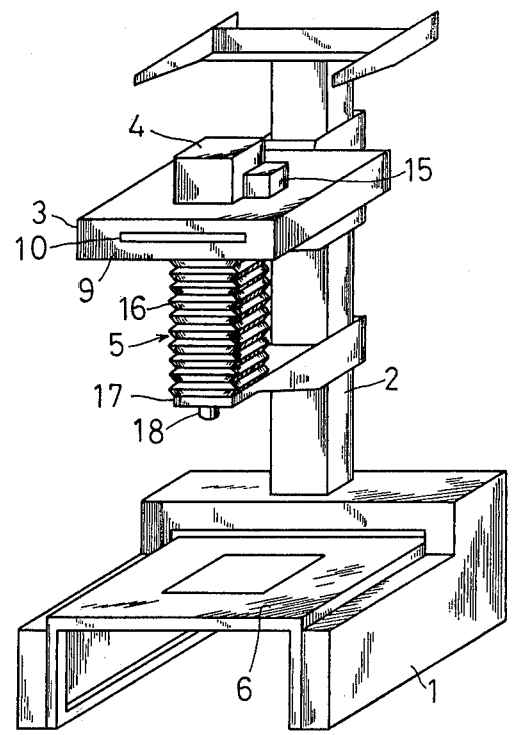
FIG. 1 is a perspective view of the apparatus embodying this invention.

Referring now to the drawings more particularly, especially FIG. 1, the apparatus embodying this invention comprises a base frame 1, a vertical supporting post 2 connected at its lower end to the base frame 1 and a master copy holding frame 3 spaced above the base frame 1 and secured to the vertical supporting post 2 in the vicinity of its upper end. A light source 4 is carried on the upper surface of the master copy holding frame 3 and a lens system 5 depends from the underside of the master copy holding frame 3. A copy paper holding plate 6 is supported on the base frame 1. The light source 4, the lens system 5 and the copy paper holding plate 6 are positioned in coaxial relationship to one another.

Figure 2:
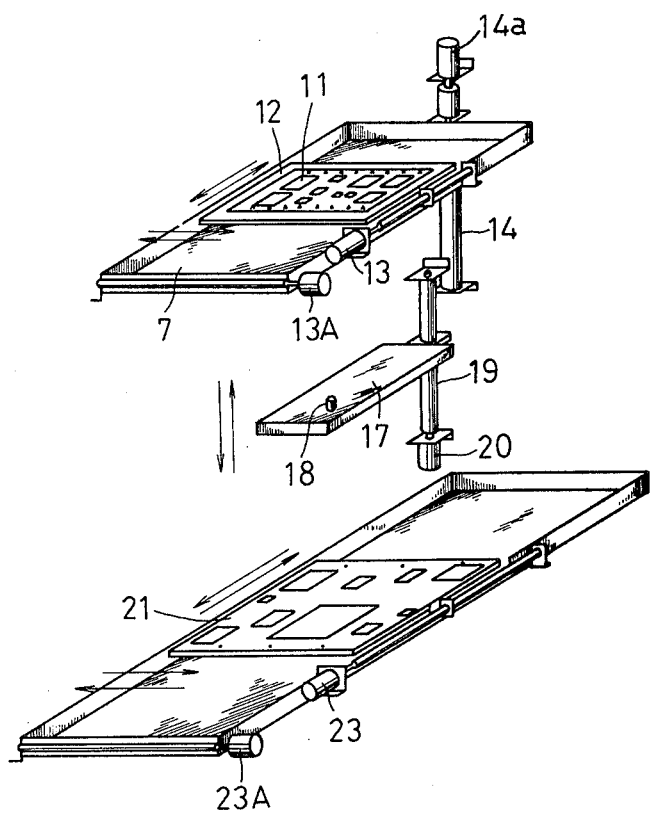
FIG. 2 is a perspective view showing the various operating means employed in the apparatus of FIG. 1.

A movable plate 7 (FIG. 2) is provided in the interior of the master copy holding frame 3 which also contains a masking cover 8 (FIG. 3) spaced above the movable plate 7 and extending across the axis of the light emitted by the light source 4. The front side wall 9 of the master copy holding frame 3 is formed with a horizontally extending slit opening 10 through which a master copy holding plate 12 carrying a plurality of master films 11 can be inserted into the master copy holding frame 3 to be secured to the movable plate 7. The master copy holding plate 12 is shown in FIGS. 2 and 3 and the master films 11 in FIG. 2. The movable plate 7 is horizontally movable both longitudinally and transversely of the master copy holding frame 3 as indicated by arrows in FIG. 2. A mechanism 13 is provided for effecting the horizontal sliding movement of the movable plate 7 longitudinally of the master copy holding frame 3 as shown in FIG. 2. Another mechanism 13A is provided for effecting the horizontal sliding movement of the movable plate 7 transversely of the master copy holding frame 3. The masking cover 8 is a disc having a plurality of differently sized windows 8a for exposure as shown in FIG. 3A. The movable plate 7 is, thus, movable to move the master films 11 one by one for exposure through the masking cover 8. The masking cover 8 is rotatable about a center deviating from the axis of the light emitted by the light source 4. The movements of the individual master films 11 are recorded in an electronic computer not shown.

The master copy holding frame 3 is provided with a raising and lowering mechanism which includes a vertical rod 14 (FIG. 2.) provided in the interior of the supporting post 2. The vertical rod 14 is provided with a driving member 14a which is used to raise and lower the vertical rod 14 to raise and lower the master copy holding frame 3 along the supporting post 2, so that the individual master films 11 can be moved toward or away from a lens 18 to obtain a desired degree of magnification. The vertical movement of the master copy holding frame 3 is also recorded in the computer not shown.

The light source 4 is provided with an adjusting device 15 which measures and adjusts the amount of light to suit the requirements for the contact copying of the individual master films 11. The amounts of light measured and the duration of exposure are recorded in the computer not shown.

The lens system 5 includes a bellows 16 extending downwardly from the underside of the master copy holding frame 3 and provided at its lower end with a lens mount 17 on which the lens 18 is supported. The lens mount 17 extends horizontally and is vertically movably supported on the supporting post 2. At its rear end, the lens mount 17 is supported on a vertical rod 19 (FIG. 2) positioned in the interior of the supporting post 2. The vertical rod 19 is provided at its lower end with a driving member 20 which is used to actuate the vertical rod 19 to raise and lower the lens mount 17. A focusing plate 21 is provided on the copy paper holding plate 6 and shown in FIG. 2. The master films 11 are selectively caused to project an image on the focusing plate 21. The computer not shown records the vertical position of the lens mount 17 which is optimum for the lens 18 to obtain the best focus suited for magnification or reduction of the individual master films 11. The lens system 5 is provided with an iris 22 (FIG. 3) which automatically regulates the admission of light to the lens 18 to suit the ratio of magnification appropriate for any desired enlargement or reduction of projected images as obtained through the vertical positional adjustment of the master copy holding frame 3 and the lens system 5. The amount of the light thus regulated is recorded in the computer not shown.

The focusing plate 21 is horizontally movable both longitudinally and transversely of the copy paper holding plate 6. A mechanism 23 is provided for effecting the sliding movement of the focusing plate 21 longitudinally of the copy paper holding plate 6 as indicated by arrows in FIG. 2. The copy paper holding plate 6 is further provided with another mechanism 23A for effecting the sliding movement of the focusing plate 21 transversely of the copy paper holding plate 6 as indicated by arrows in FIG. 2. Any desired master film 11 is, thus, projected on the axis of the light emitted by the light source. The computer not shown records the amounts of the horizontal movements of the focusing plate 21 with respect to the individual master films 11. Four overlays 24 are slidably provided above the focusing plate 21 as shown in FIGS. 4 and 5. Each of the overlays 24 is provided with a driving member as indicated at 25, 25A, 26 and 26A in FIG. 4, so that the overlays 24 are slidable in the directions indicated by arrows in FIG. 4 to prevent passage of light to any area other than that which corresponds to the selected master film 11. The amount of the sliding movement of each overlay 24 is recorded in the computer.

A rotating member 27 is provided on the underside of the focusing plate 21 as shown in FIGS. 3 and 5 to rotate the focusing plate 21 when the selected master film 11 is projected on the focusing plate 21. This rotational positional adjustment, which is additional to the sliding adjustments, is effected for each image projection on the focusing plate 21. The amount of such rotation of the focusing plate 21 is also recorded in the computer.

The various data recorded in the computer are utilized to formulate an operating program for the various operating or driving members or mechanisms of the apparatus. The master films 11 on the master copy holding plate 12 are automatically projected one after another on the focusing plate 21 and a contact screen 28 is brought into contact with an unexpected film 29 as shown in FIG. 5. to record an image on the film 29. The contact screen 28 is selected to suit a negative for one of the colors involved. Then, the master copy holding plate 12 is removed from the master copy holding frame 3. Another set of master films 11 is placed in position on the master copy holding plate 12 in the master copy holding frame 3 to effect recording in a different color. The apparatus is placed in operation in accodance with a different operational program adapted for such different color. The operation is repeated for each of the four colors, so that a negative for each color is obtained.

While this invention is very useful for the manufacture of negatives to be used for making plates, it will be understood that it is also advantageously applicable to the reproduction of colored or monochromatic images by projecting on printing paper individual images of different shapes with a selected rate of magnification from any desired film selected from among a plurality of master films.

Although the invention has been described with reference to a preferred embodiment thereof, it should be understood that modifications or variations may be easily made by those skilled in the art without departing from the spirit and scope of this invention as defined by the appended claims.

What I claim is:

1. An apparatus for making reproductions or negatives for use in plate making, comprising:

a base frame;

a vertical supporting post secured at its lower end to said base frame;

a master copy holding frame spaced above said base frame and vertically movable supported on said supporting post;

a computor means for controlling the vertical position of said copy holding frame in a programmable manner;

a light source carried on said master copy holding frame;

a lens system depending from the underside of said master copy holding frame;

a copy paper holding plate carried on said base frame;

a movable plate carried by said master copy holding frame, said plate being movable in a horizontal plane both longitudinally and transversely of said master copy holding frame, said movement being controlled by said computor means in a programmable manner;

said light source, said lens system and said copy paper holding plate being aligned with one another with respect to the axis of light emitted by said light source by means of said computor means in a programmable manner;

means connected to said master copy holding frame for effecting its vertical movement, said vertical movement being controlled by said computor means in a programmable manner;

a master film holding plate adapted to support a plurality of master films thereon and be removably secured to said movable plate, said movable plate being movable to position any selected one of said master films for exposure to said light, said movement being controlled by said computor means in a programmable manner;

a masking cover provided in said master copy holding frame for selective exposure of said master films to said light, said selection of exposure being controlled by said computor means in a programmable manner;

a focusing plate carried on said copy paper holding plate movably in a horizontal plane both longitudinally and transversely of said copy paper holding plate, said movement being controlled by said computor means in a programmable manner; and a plurality of horizontally movable overlays provided above said focusing plate.

2. The apparatus as defined in claim 1, wherein said means for effecting the vertical movement of said master copy holding frame comprises a vertical rod provided in said supporting post, which is of the hollow construction, and a handle member attached to one end of said vertical rod.

3. The apparatus as defined in claim 1, wherein said means for effecting said horizontal movement of said movable plate comprises a pair of members associated with said movable plate, one of which is operable for effecting said horizontal movement of said movable plate longitudinally of said master copy holding frame, while the other is for effecting said horizontal movement transversely of said master copy holding frame.

4. The apparatus as defined in claim 1, wherein said means for effecting said vertical movement of said lens system comprises a vertical rod provided in said supporting post, which is of the hollow construction, and a handle member attached to one end of said vertical rod.

5. The apparatus as defined in claim 4, wherein said lens system includes a horizontally extending lens mount, a bellows depending from the underside of said master copy holding frame and connected at its lower end to said lens mount and a lens carried on said lens mount adjacent to one end thereof, said vertical rod being connected to an opposite end of said lens mount to vertical move said lens mount to effect said vertical movement of said lens system.

6. The apparatus as defined in claim 1, wherein said masking cover provided in said master copy holding frame comprises a turret with varying sizes of masks thereon, control of said turret being by said computor means in a programmable manner.

* * * * *